(12) United States Patent  
Campesato et al.

(10) Patent No.: US 10,109,758 B2  
(45) Date of Patent: Oct. 23, 2018

(54) PHOTOVOLTAIC CELL WITH VARIABLE BAND GAP

(71) Applicant: CESI—Centro Elettrotecnico Sperimentale Italiano Giacinto Motta S.p.A., Milan (IT)

(72) Inventors: Roberta Campesato, Cologno Monzese (IT); Gabriele Gori, Seriate (IT)

(73) Assignee: CESI—Centro Elettrotecnico Sperimentale Italiano Giacinto Motta S.p.A., Milan (IT)

( * ) Notice: Subject to any disclaimer, the term of this patent is extended or adjusted under 35 U.S.C. 154(b) by 172 days.

(21) Appl. No.: 14/909,219

(22) PCT Filed: Jul. 28, 2014

(86) PCT No.: PCT/EP2014/066170  
§ 371 (c)(1),  
(2) Date: Feb. 1, 2016

(87) PCT Pub. No.: WO2015/014788  
PCT Pub. Date: Feb. 5, 2015

(65) Prior Publication Data  
US 2016/0190376 A1      Jun. 30, 2016

(30) Foreign Application Priority Data  
Aug. 1, 2013   (IT) .............................. MI2013A1297

(51) Int. Cl.  
*H01L 31/0264*     (2006.01)  
*H01L 31/0687*     (2012.01)  
(Continued)

(52) U.S. Cl.  
CPC .... *H01L 31/0687* (2013.01); *H01L 31/03046* (2013.01); *H01L 31/065* (2013.01);  
(Continued)

(58) Field of Classification Search  
CPC ............. H01L 31/0687; H01L 31/0304; H01L 31/065; H01L 31/1844  
(Continued)

(56) References Cited

U.S. PATENT DOCUMENTS

2003/0136442 A1*  7/2003  Takamoto ........... H01L 31/0687  
136/262  
2012/0167967 A1   7/2012  Gori et al.

OTHER PUBLICATIONS

NSM, InGaAsP Band structure and carrier concentration, http://www.ioffe.ru/SVA/NSM/Semiconductor/GaInAsP/bandstr.html (downloaded Dec. 15, 2017).*

* cited by examiner

*Primary Examiner* — Jayne L Mershon  
(74) *Attorney, Agent, or Firm* — Janeway Patent Law PLLC

(57) ABSTRACT

A Monolithic photovoltaic cell is proposed. Said cell comprises at least one junction. Each one of said at least one junction comprises a base formed by a doped semiconductor material of a first conductivity type and an emitter formed by a doped semiconductor material of a second conductivity type opposed to the first. Said emitter is stacked on the base according to a first direction. The semiconductor material of the base and/or of the emitter of at least one of said at least one junction is a semiconductor material formed by a compound of at least one first element and a second element. The band gap and the lattice constant of said semiconductor material of the base and/or of the emitter depend on the concentration of said first element in said compound with respect to said second element. Said concentration of the first element in said compound with respect to the second element is not uniform along said first direction, being equal to a first value at a lower portion of said base and/or emitter and being equal to a second value lower than the first value (Continued)

Figure 1:
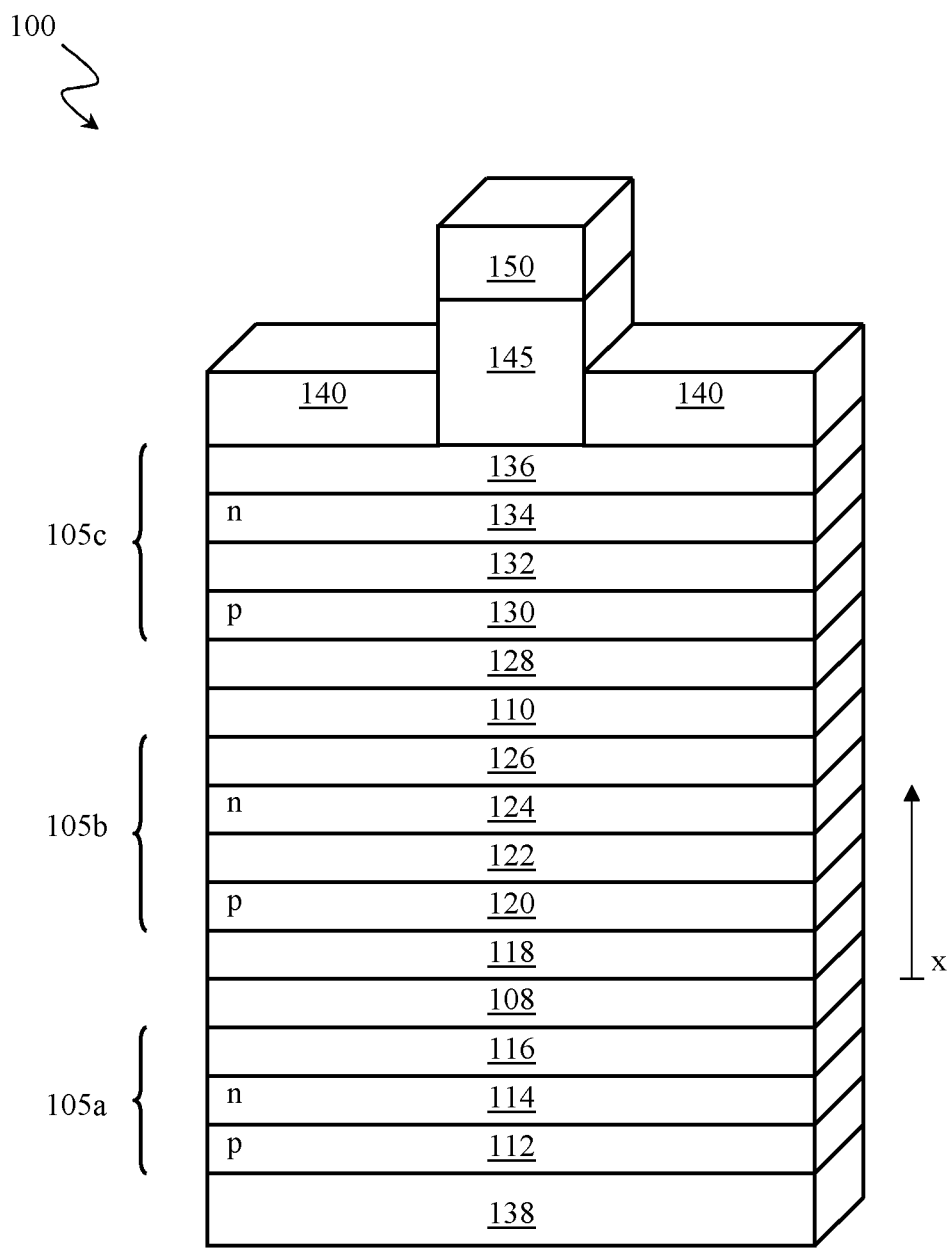

at an upper portion of said base and/or emitter. Said upper portion is above said lower portion according to the first direction.

6 Claims, 3 Drawing Sheets

(51) Int. Cl.
    *H01L 31/0304*     (2006.01)
    *H01L 31/065*     (2012.01)
    *H01L 31/18*     (2006.01)

(52) U.S. Cl.
    CPC ........ *H01L 31/1844* (2013.01); *Y02E 10/544* (2013.01); *Y02P 70/521* (2015.11)

(58) Field of Classification Search
    USPC ......................................................... 136/255
    See application file for complete search history.

PHOTOVOLTAIC CELL WITH VARIABLE BAND GAP

The present invention generally relates to the sector of the photovoltaic cells, and particularly to the photovoltaic cells for solar radiations (solar cells).

Solar cells are electronic devices capable of converting electromagnetic energy—such as the solar radiation—into electricity.

Such electronic devices are mainly comprised of semiconductor materials, which are characterized by solid crystalline structures having forbidden energy bands ("band gaps") located between the valence bands and the conduction bands. A band gap defines an energy interval which is normally inhibited to the free electrons. However, when the solar radiation hits a material of such type in a solar cell, the electrons that occupy lower energy bands may be excited to the point of making an energetic jump and exceeding the band gap, for reaching higher energy bands. For example, when electrons in the valence bands of a semiconductor absorb sufficient energy from the photons of the incident solar radiation, such electrons may exceed the band gap and reach the conduction band.

Reaching the higher energy bands, such electrons leave empty locations within the lower energy bands; such empty locations, defined in jargon with the term "holes", may move from atom to atom in the crystalline reticule. The holes act thus as charge carriers, in the same way as the free electrons in the conduction band, and contribute to the conductivity of the crystal.

In other words, each photon absorbed by the semiconductor originates a corresponding hole-electron pair. The set of electron-hole pairs formed by the photons absorption originates the so-called photocurrent of the solar cell. The holes and the electrons generated in this way may recombine with each others, subtracting their contribution to the maintenance of the photocurrent. In order to avoid (or at least to reduce as much as possible) this phenomenon for increasing the efficiency of the solar cell, a local electric field is generated within the semiconductor material. In this way, the holes and the electrons generated further to the absorption of the photons result to be accelerated by the local electric field toward opposite directions, and thus the probability that they recombine before reaching the terminals of the solar cell drastically diminishes. Particularly, such electric field is originated by means of the generation of a spatial charge region, such as the depletion region obtainable by means of the generation of a pn junction between a pair of oppositely doped semiconductor materials.

The solar cells may be of the single pn or np junction-type, or single-junction solar cells, or may be of the more-than-one pn or np junctions-type, or multi-junction solar cells.

The single-junction solar cells are substantially constituted by the presence of a single pn or np junctions. Conversely, the multi-junction solar cells are implemented by stacking various pn or np junctions, presently, from two to five junctions. The different junctions are made in different semiconductor materials, and are electrically connected to each others in series by means of tunnel diodes interposed between each pair of adjacent junctions.

Each of the different superimposed junctions forms a so-called elementary cell, and the various elementary cells are capable of singularly converting the various portions of the incident solar radiation spectrum, in a more efficient way compared to the one obtainable with a single junction.

The multi-junction cells have the advantage of being capable of providing a higher output voltage with respect to the single-junction cells, the overall voltage being equal to the sum of the voltages of the single elementary cells (minus a little voltage drop in the tunnel diodes serially connecting the cells).

During the last years, the performances of solar cells based on semiconductor materials based on compounds of elements of the III and V groups of the periodic table of the elements, hereinafter simply referred to as "III-V materials", and in particular of GaAs solar cells, have been subjected to a continuous increasing, thanks to the progress of technologies that allow to develop new materials for manufacturing three, four and also five junction cells.

The cost of a multi-junction solar cell is slightly higher than the cost of a single-junction one, and its efficiency is heavily higher (in a condition of out-of-terrestrial-atmosphere illumination at 25° C., the efficiency is approximately equal to 30% for a triple-junction cell, compared to the 20% of a single-junction one); for this reason, especially for aerospace applications, the market is oriented toward the use of this new, more efficient, devices. For example, the present big telecommunication satellites requires the use of triple-junction solar cells. These cells have on the other hand an employ in terrestrial applications, such as in the optical concentration systems.

In order to be manufactured, the various material layers directed to form the junctions of a solar cell are typically obtained with the epitaxial growth technique through deposition (for example by means of the MetalOrganic Chemical Vapor Deposition technique, or MOCVD) on commercial substrates. In order to manufacture solar cells of III-V materials, the materials that are more used as a substrate are the germanium (Ge) and/or the gallium arsenide (GaAs). Other materials usable as substrates comprise for example Silicon (Si).

Manufacturing a solar cell by epitaxially growing one or more layers on a substrate by deposition requires that the materials of the layers to be grown have a lattice constant compatible with that of the material that forms the substrate. Indeed, if a layer of material was grown with a lattice very different from that of the substrate material, during the deposition operation crystallographic defects (in jargon, "dislocations") would be formed, such to significantly degrade the opto-electronic and transport properties of the junctions of the resulting solar cell.

The aforementioned lattice constant compatibility constraint limits the choice of III-V materials which may be employed in the present solar cells—for example in triple-junction solar cells with Ge substrate—hampering the development of new solar cells with efficiencies that are better than those currently being developed. Indeed, the need to choose materials with a lattice constant compatible with that of the substrate, makes difficult the realization of new structures in which the junctions are made of materials whose band gaps allow a better conversion of the solar spectrum.

In order to increase the efficiency of solar cells formed of III and V materials, a known solution provides to use also materials having lattice constants that are not compatible with the lattice constant of the substrate, inserting between each pair of layers of materials having lattice constants that are not compatible an ad hoc matching structure adapted to confine the crystallographic defects in it, preventing the degradation of the performance of the solar cell. Each matching structure is made between a first junction having a first lattice constant and a second junction having a second lattice constant (different from the first) in a region of the cell which is not active from the photovoltaic point of view, typically between the first junction and the tunnel diode which connects the second junction. The matching structure is typically realized through a sequence of layers of a same material (for example, InGaAs, InGaP, AlInGaP). Each layer has a respective lattice constant (which is constant throughout the layer), with the first layer of the sequence (in contact with the first junction) that has a lattice constant equal to that of the material which forms the first junction, with the subsequent intermediate layers having lattice constants that gradually get closer to the lattice constant of the material that forms the second junction, and a last layer (in contact with the tunnel diode) that has a lattice constant equal to that of the material that forms the second junction. The lattice constants of the various layers are set by adjusting in each layer the concentration of two of the elements that form the compound of the material of this layer. Currently, however, there is still no evidence that these structures are also capable of preventing the propagation of crystallographic defects in other areas of the solar cell during its operational life. For example, the temperature variations undergone by the solar cell during its operational life induce mechanical stresses in the materials that constitute it, such as to allow the propagation of crystallographic defects—initially confined in the matching structures—to the entire structure of the solar cell.

It is also known to manufacture solar cells comprising at least a junction including a layer of material based on a compound of indium (In), gallium (Ga) and phosphorus (P)—or InGaP—or of In, Ga and arsenic (As)—or InGaAs—with a uniform concentration of In along the entire depth of the layer. By increasing said uniform concentration of In in the material of at least one of the two layers forming a junction, it is known that the corresponding band gap decreases. Given that as the band gap decreases, the portion of the solar spectrum that can be converted accordingly increases, with this technique it is possible to increase the current produced by the solar cell. However, the use of this technique is not free from drawbacks. First, it is known that by decreasing the band gap, the voltage that develops across the terminals of the junction accordingly decreases. Moreover, by increasing too much the In concentration, the lattice constant of the material is altered, accordingly introducing crystallographic defects capable of degrading the optoelectronic and transport properties of the solar cell. The presence of such crystallographic defects increases as the thickness of the layer of material with a high concentration of In increases.

In light of the foregoing, the Applicant has observed that the solutions currently known in the state of the art regarding the implementation of photovoltaic cells, and in particular for the implementation of solar cells, can be improved from the point of view of the efficiency.

Different aspects of the solution in accordance with an embodiment of the present invention are indicated in the independent claims.

One aspect of the present invention regards a monolithic photovoltaic cell. Said monolithic photovoltaic cell comprises at least one junction. Each one of said at least one junction comprises a base formed by a doped semiconductor material of a first conductivity type and an emitter formed by a doped semiconductor material of a second conductivity type opposed to the first. Said emitter is stacked on the base according to a first direction. The semiconductor material of the base and/or of the emitter of at least one of said at least one junction is a semiconductor material formed by a compound of at least one first element and a second element. The band gap and the lattice constant of said semiconductor material of the base and/or of the emitter depend on the concentration of said first element in said compound with respect to said second element. Said concentration of the first element in said compound with respect to the second element is not uniform along said first direction, being equal to a first value at a lower portion of said base and/or emitter and being equal to a second value lower than the first value at an upper portion of said base and/or emitter. Said upper portion is above said lower portion according to the first direction.

A further aspect of the present invention relates to a corresponding method for manufacturing a photovoltaic cell.

Advantageous embodiments are described in the dependent claims.

Figure 2:
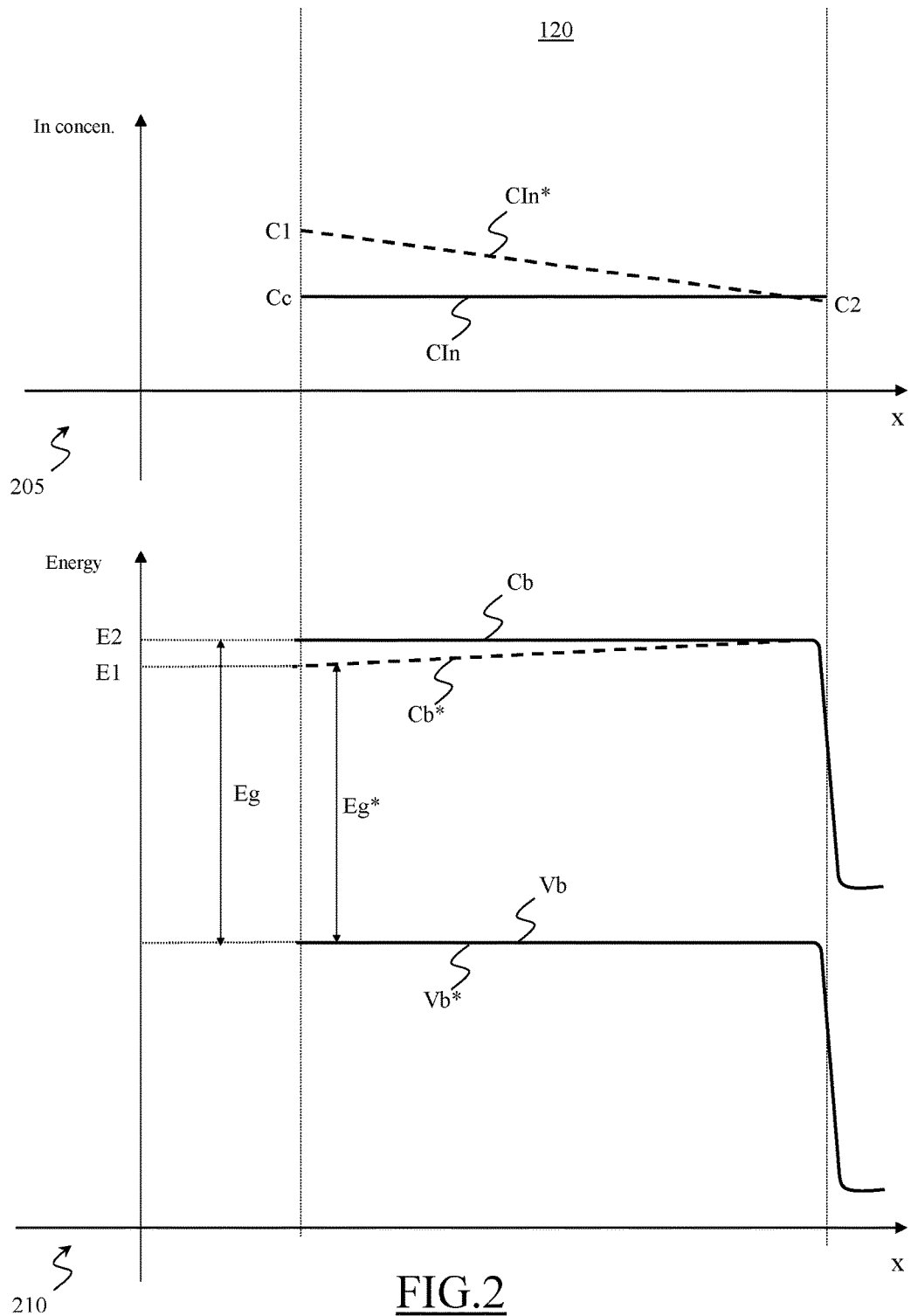
Figure 3:
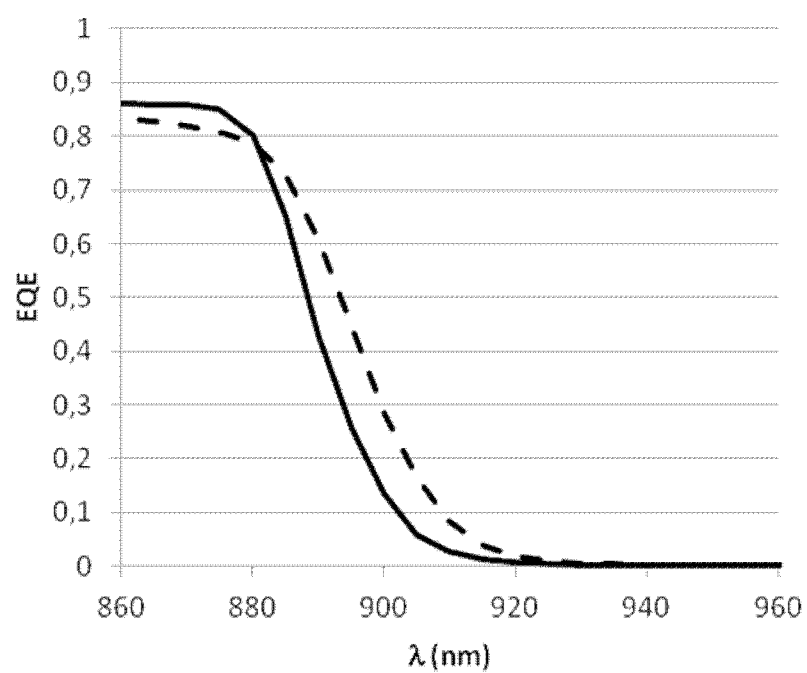

The solution according to one or more embodiments of the invention, as well as additional features and its advantages will be better understood by reference to the following detailed description, given purely by way of a non-restrictive indication and without limitation, to be read in conjunction with the attached figures. On this regard, it is expressly intended that the figures are not necessarily in scale and that, unless differently indicated, they are simply intended to be conceptually illustrative of the described structures and procedures. In particular:

FIG. 1 schematically shows a vertical sectional view of a monolithic photovoltaic cell;

FIG. 2 shows a diagram of the concentration of In in the compound that forms a base of the cell of FIG. 1 and a diagram of the corresponding conduction and valence bands that develop in this base in accordance with an embodiment of the present invention; and FIG. 3 is a graph which shows how the external quantum efficiency of the cell of FIG. 1 changes from a uniform concentration profile of In to a decreasing concentration profile of In.

With reference to the drawings, and in particular to FIG. 1, it is schematically shown in vertical section a monolithic photovoltaic cell, particularly but not limitatively a solar cell, in which the concepts in accordance with an embodiment of the present invention can be applied. The photovoltaic cell, identified as a whole with the reference 100, is a multi-junction cell with three junctions, and comprises a first elementary cell, identified in figure by reference 105*a* and called "lower cell", a second elementary cell, identified by reference 105*b* and called "intermediate cell", and a third elementary cell, identified by reference 105*c* and called "upper cell". The upper cell 105*c* is located above the intermediate cell 105*b*, which is in turn placed above the lower cell 105*a*.

The three elementary cells are electrically connected in series, interposed with tunnel diodes; in particular, the lower cell 105*a* is electrically connected to the intermediate cell 105*b* by means of a first tunnel diode, identified in figure with the reference 108, while the intermediate cell 105*b* is electrically connected to the upper cell 105*c* through a second tunnel diode, identified in figure with the reference 110.

The lower cell 105*a* comprises a first semiconductor material layer 112 (referred to as "base") of a first conductivity type, for example of the p-type, and a second semiconductor material layer 114 (referred to as "emitter") of the opposite conductivity type, for example of the n-type. The base 112 and the emitter 114 are positioned directly in contact with each other, in order to form a pn junction. A further semiconductor material layer 116, called "window layer" is preferably formed above the emitter 114, the presence of which allows to reduce the surface recombination effect of the charge carriers photogenerated in the layer 114, thus increasing the conversion efficiency of the photovoltaic cell 100.

The tunnel diode 108 is formed above the window layer 116.

A barrier layer 118 is preferably placed between the tunnel diode 108 and the intermediate cell 105b, the presence of which allows to create an electric field that pushes charge carriers photogenerated in the layer 120 toward the space-charge region of the cell and to reduce the surface recombination effect of the charge carriers photogenerated in the layer 120, thereby increasing the conversion efficiency of the photovoltaic cell 100.

The intermediate cell 105b, formed above the barrier layer 118, comprises a first semiconductor material layer 120 (base) of the first conductivity type, for example p-type; a second layer 122, called "spacer layer", is preferably formed above the base 120, which consists of not intentionally doped semiconductor material. The intermediate cell 105b further comprises a third semiconductor material layer 124 (emitter) located above the spacer layer 122. The emitter 124 is composed of a semiconductor material of the conductivity type opposite to that of the base 120, for example of the n-type. Similarly to the lower cell 105a, a window layer 126 is preferably formed above the emitter 124 of the intermediate cell 105b.

The tunnel diode 110 is formed above the window layer 126. A further barrier layer 128 is preferably placed between the tunnel diode 110 and the upper cell 105c.

The upper cell 105c, formed above the barrier layer 128, comprises a first semiconductor material layer 130 (base) of the first conductivity type, for example of the p-type; a spacer layer 132 of semiconductor material intentionally undoped is preferably formed above the base 130. A third semiconductor material layer 134 (emitter) of the conductivity type opposite to that of the base 130, for example n-type, is formed above the spacer layer 132. A window layer 136 is preferably formed above the emitter 134.

On the back of the photovoltaic cell 100, and in particular in correspondence of the surface of the base 112 opposite to surface facing the emitter 114, there is formed a first layer of conductive material 138, for example of a metal such as gold (Au) or silver (Ag), which constitutes a first contact terminal of the photovoltaic cell 100.

A cap 145 of semiconductor material of a prescribed conductivity type, for example of the n-type, is piecewise-formed above the window layer 136 corresponding to the upper cell 105c; a contact of conductive material 150, for example of a metal such as Au or Ag, is formed on the cap 145, which constitutes a second contact terminal of the photovoltaic cell 100.

A covering layer 140 of non-reflecting material, constituted for example by one or more oxide layers, is formed above the window layer 136. A suitable passage toward the metal 150 is left in the non-reflecting covering layer 140 to allow the photovoltaic cell 100 to be contacted externally.

Looking in more detail the elementary cells that constitute the overall photovoltaic cell 100, the lower cell 105a has the base 112 that is constituted by doped Germanium (Ge) of the first conductivity type—in the example considered of the p-type. The emitter 114 of the lower cell 105a is formed of the same material of the base 112, for example Ge, but doped in the opposite way—in the example considered, of the n-type.

The window layer 116 may be constituted by a layer of III-V material such as a quaternary or ternary compound, for example a compound of indium (In), gallium (Ga) and phosphorus (P), i.e., InGaP, a compound of In, Ga and arsenic (As), i.e., InGaAs, a compound of aluminum (Al), Ga and As, i.e., AlGaAs.

The tunnel diode 108 is implemented in a known manner, for example by a first layer formed of doped III-V material of the second type of conductivity—in the example considered, the n-type—and a second material layer formed of doped III-V material of the opposite conductivity type—in the example considered, the p-type.

The barrier layer 118 is formed of a semiconductor material, such as a III-V material, such as doped AlGaAs, AlGaInP or InGaP of the first conductivity type—in the example considered, of the p-type.

The intermediate cell 105b has the base 120 made of a doped III-V material, such as a quaternary or ternary compound, for example, InGaAs, of the first conductivity type—in the example considered the p-type. The emitter 124 of the intermediate cell 105b is formed of a further III-V material, for example the same material of the base 120, such as InGaAs, doped in the opposite way—in the example considered, the n-type. The spacer layer 122 is formed by a semiconductor material, for example the same of the base 120; however, the material of the spacer layer 122 is intrinsic, i.e., devoid of an appreciable amount of dopant impurities.

The window layer 126 may be constituted by a layer of III-V material, such as AlGaAs, AlInGaP, AlInP or InGaP.

The tunnel diode 110 may be realized by a first layer formed of doped III-V material of the second type of conductivity—in the example considered, the n-type—and a second layer formed of doped III-V material of the opposite conductivity type—in the example considered, the p-type.

In a way similar to the barrier layer 118, the barrier layer 128 is formed of a semiconductor material, such as a doped III-V material such as AlGaInP or AlInP of the first conductivity type—in the example considered, the p-type.

The upper cell 105c has the base 130 made of a III-V material such as a quaternary or ternary compound, for example doped InGaP of the first conductivity type—in the example considered the p-type. The emitter 134 of the upper cell 105c is formed of a further III-V material, for example the same material of the base 130, such as InGaP, but doped in the opposite way—in the example considered, the n-type. The spacer layer 132 is realized by means of III-V material, for example the same of the base 130; however, the material of the spacer layer 132 is intrinsic, i.e., devoid of an appreciable amount of dopant impurities.

In a similar way to the window layer 126, the window layer 136 may be constituted by a layer of III-V material, such as AlInP.

From the point of view of the manufacturing process, the photovoltaic cell 100 is fabricated from a substrate of semiconductor material that forms the base 112 of the lower cell 105a—in the example considered, Ge—of the proper conductivity type—in the example considered, the p type—, and with an adequate concentration of dopants. In particular, through deposition and/or diffusion processes, starting from such a substrate that acts as the base 112, the emitter 114 of the lower cell 105a is formed. All the subsequent layers of the photovoltaic cell 100 up to the window 136 are obtained by suitable techniques of epitaxial growth, such as Molecular Beam Epitaxy, "MBE", or by Metal-Organic Chemical Vapour Deposition, "MOCVD", using the emitter 114 and the base 112 of the lower cell 105a as massive substrate.

In accordance with an embodiment of the present invention, the concentration of In in the InGaAs compound which forms the base 120 of the intermediate cell 105b is not uniform, but is varied along its depth, i.e., along the direction identified in FIG. 1 with the reference x, from a first value C1 in the lower portion of the base (for example, at the interface between the base 120 and the barrier 118 below) to a second value C2<C1 in the upper portion of the base (for example, at the interface between the base 120 and the spacer layer 122 above).

Referring to the case in which the subsequent layers of the photovoltaic cell 100 are obtained by MOCVD technique, the variation of the concentration profile of In in the base of the intermediate cell 105b may be for example achieved by varying the flow of the carrier gas of the precursor of In with respect to the flow of the carrier gas of the precursor of Ga (or vice versa) during the growth process.

In order to describe in detail the effects produced by the presence of a non-uniform concentration of In in the InGaAs compound which forms the base 120, and illustrate the advantages obtainable from such a solution, reference will now be made to FIG. 2.

FIG. 2 shows a diagram 205 of the concentration of In in the InGaAs compound which forms the base 120 along the x direction, and a diagram 210 of the corresponding conduction and valence bands that develop in the base 120 along the x direction resulting from the concentration of In of the diagram 205.

Referring to the diagram 205, with the continuous line it is shown the concentration $CIn$ of In in the InGaAs compound of the base 120 according to a known solution, wherein the concentration $CIn$ is uniform along the entire thickness of the base 120, i.e., has a constant value $Cc$ along the x direction. With the dashed line it is shown the concentration $CIn^*$ of In in the InGaAs compound of the base 120 according to a solution in accordance with an embodiment of the present invention, wherein such concentration $CIn^*$ decreases linearly along the x direction from a first value $C1 \geq Cc$ at the interface between the base 120 and the barrier 118 below to a second value $C2<C1$ at the interface between the base 120 and the spacer layer 122 above.

For example, according to one embodiment of the present invention, C1 may be such that the In/Ga ratio in the InGaAs compound is equal to 3-10%, while C2 may be such that the In/Ga ratio in the InGaAs compound is equal to 0-2%.

Making reference to the diagram 210, with the continuous line there are shown the conduction band $Cb$ and the valence band $Vb$ that develop in the base 120 along the x direction resulting from the uniform concentration $CIn$ shown in the diagram 205 according to a known solution. With the dashed line there are shown the conduction band $Cb^*$ and the valence band $Vb^*$ that develop in the base 120 along the x direction resulting from the decreasing (along the x direction) concentration $CIn^*$ shown in the diagram 205 according to a solution in accordance with an embodiment of the present invention.

In the known case of uniform concentration $CIn$ of In, the band gap $Eg$, equal to the difference (in terms of electronic energy) between the conduction band $Cb$ and the valence band $Vb$, turns out to have an $Eg$ value nearly uniform throughout the depth of the base 120, i.e., a constant value as x changes.

Thanks to the decreasing profile of the concentration $CIn^*$ along the x direction, the conduction band $Cb^*$ in accordance with an embodiment of the present invention exhibits portions having electronic energy values lower than those of the conduction band $Cb$ corresponding to the uniform concentration $CIn$, while the valence bands $Vb$ and $Vb^*$ are substantially coincident. The conduction band $Cb^*$ has lower electronic energy values where the concentration of In is higher. Consequently, with a decreasing concentration profile such as the profile $CIn^*$ shown in FIG. 2, the corresponding conduction band $Cb^*$ exhibits lower electronic energy values (lower than those of the conduction band $Cb$) in the deepest regions of the base 120 (i.e., for low values of x), and larger and larger values as the interface with the spacer layer 122 is approached (i.e., as x increases). Consequently, in the case of decreasing concentration $CIn^*$, the band gap $Eg^*$, equal to the difference (in terms of electronic energy) between the conduction band $Cb^*$ and the valence band $Vb^*$, is no longer constant along the entire depth of the base 120, but varies as a function of x. Having the concentration $CIn^*$ a decreasing profile that starts from an initial value $C1 \geq Cc$ at the interface between the base 120 and the barrier 118 and ends to a final value $C2<C1$ at the interface between the base 120 and the spacer layer 122, the band gap $Eg^*$ has a profile that increases as x increases, which starts from an initial value $E1<Eg$ at the interface between the base 120 and the barrier 118 until it reaches a final value $E2>E1$ at the interface between the base 120 and the spacer layer 122.

In this way, the incident photons are absorbed as they pass through the material layer which forms the base 120, with the lower energy photons that are left to move from the most superficial portions of the base 120 and are converted in the deepest portions of it (where the band gap $Eg^*$ has smaller values).

Referring again to FIG. 2, the overall efficiency of a solar cell 100 with the decreasing concentration profile $CIn^*$ turns out to be greater than that of a solar cell with the uniform concentration profile $CIn$, as in the deeper portions of the base 120, in the first case, the forbidden band has lower values.

Compared to a simple uniform increase in the concentration of In along the entire depth of the base 120, using the decreasing concentration profile $CIn^*$ in accordance with the embodiment of the invention just described allows to increase the cell efficiency without incurring (or at least incurring to a limited extent) in the drawbacks mentioned in the introductory section of this document for the following reasons.

First, the fact of having reduced the band gap $Eg^*$ not in a uniform manner, but only in correspondence of certain portions of the base 120 (in the deeper portions of it), allows to limit the reduction of the voltage that develops across the terminals of the junction. This voltage is indeed proportional to the built-in potential of the junction, which primarily depends on the value of the band gap in correspondence of the space-charge region of the junction (which region is in the most superficial part of the base, where the band gap has not been decreased).

Furthermore, it was observed that the crystallographic defects caused by epitaxial growth of a material having a lattice constant that is not compatible with that of the substrate on which it is grown, are generated only if the thickness of the layer with not compatible lattice constant to be grown exceeds one critical thickness $THc=k/d$, where $k$ is a constant and $d$ represents the difference between the lattice constants of the two materials. Therefore, the more the difference between the lattice is low, the greater the thickness of material having a lattice constant that is not compatible that can be grown without incurring in crystallographic defects. In the solution in accordance with an embodiment of the invention just described, the base 120 does not have a constant lattice constant, but varies along the x direction as a function of the concentration profile CIn* of In. The decreasing concentration profile CIn* of In is advantageously modulated in such a way that the base 120 exhibits a lattice constant not compatible with that of the lower cell 105a that acts as a substrate for the epitaxial growth (i.e., Ge) only in a deep portion of the base having a thickness lower than THc, while in rest of the base 120 exhibits a compatible lattice constant. In this way, it is possible to advantageously increase the cell efficiency without incurring in the formation of crystallographic defects such as to degrade the performance of the solar cell.

In the embodiment of the invention which has been described in detail in FIG. 2, the concentration profile CIn* of In in the base 120 is strictly decreasing. The concepts of the present invention may however also apply to other types of non-uniform concentration profiles of In with respect to x, provided that the C1 value in the lower portion of the base (for example, between the base 120 and the barrier 118 below) is greater than the value of C2 in the upper portion of the base (for example, at the interface between the base 120 and the spacer layer 122 above).

For example, in accordance with one embodiment of the present invention, the concentration of In in the InGaAs compound of the base 120 may be, with respect to x, a generic not increasing function, a piecewise linear decreasing function, a decreasing polynomial function, an inverse proportionality function, or also a function comprising at least an increasing portion.

In the solutions in accordance with embodiments of the present invention, the band gap Eg* exhibits a profile that is not uniform with respect to x, which starts from an initial value E1 at the interface between the base 120 and the barrier 118 until it reaches a final value E2>E1 at the interface between the base 120 and the spacer layer 122. Such a profile of the band gap Eg* causes the generation of an electric field, directed so as to hinder the diffusion of the carriers towards the junction.

In order to further increase the efficiency of the solar cell, the electric field can be compensated by an opposite electric field, generated by modulating the concentration of p type dopant in the base 120 so that it has a decreasing profile along the x direction. In this way, thanks to the presence of this second electric field, the carriers are pushed towards the junction, allowing to fully exploit the benefits obtained by the decrease of the band gap Eg* without altering the effective diffusion length. This solution is described in the patent application WO 2011/009 857 owned by the Applicant, and is incorporated herein by reference in its entirety.

FIG. 3 is a graph showing an example of how the External Quantum Efficiency (EQE) of a solar cell having three junctions may change going from a uniform concentration profile CIn of In (continuous line) to a decreasing concentration profile CIn* of In (dashed line). As can be seen from the figure, due to the decreasing concentration profile CIn* of In, there is a shift of the absorption threshold towards wavelengths at lower energies.

Although in the present description reference has been explicitly made to a particular solar cell, i.e., the solar cell 100 having three junctions illustrated in FIG. 1, comprising a lower cell 105a made of Ge, an intermediate cell 105b made of InGaAs, and an upper cell 105c made of InGaP, with the base 120 of the intermediate cell 105b having a non-uniform concentration profile CIn* of In, the concepts of the present invention may also be applied to solar cells of different structure, comprising at least one junction comprising at least one layer of a semiconductor material based on a compound comprising In. For example, an exemplificative and not exhaustive list of solar cells in which the concepts of the present invention can be applied may comprise:

Unijunction solar cells with (not active) substrate of Ge, and a junction made of InGaAs. In this case, the non-uniform concentration profile of In may be advantageously applied to the base of the only junction of the cell.

Solar cells having two junctions with (not active) substrate of Ge, a first lower junction formed of InGaAs, and an upper junction made of InGaP. In this case, the non-uniform concentration profile of In can be advantageously applied to the base of the lower junction.

Solar cells having four junctions provided with (starting from the bottom) a first junction of Ge, a second junction of InGaAs, a third junction of Al(In)GaAs, and a fourth junction of AlInGaP. In this case the non-uniform concentration profile of In can be advantageously applied to the base of the second junction and/or to the base of the third junction and/or to the base of the fourth junction.

Furthermore, the concepts of the present invention can be applied not only to solar cells comprising semiconductor materials based on compounds comprising In, but also in general to all semiconductor materials based on compounds (i.e., formed of a compound of more than one element) wherein the band gap and the lattice constant depend on the concentration of at least one element of the compound with respect to at least one other element of the compound. In these cases, the band gap is made to vary with a non-uniform concentration profile of that at least one element along the depth of the layer where such element is included.

For example, the concepts of the present invention may be applied to semiconductor materials formed of compounds of three or more different elements belonging to at least two different groups (e.g., groups III and V), for example, AlGaAs, GaAsSb, GaInAsSb, GaInAsP, GaInSb, or also to semiconductor materials formed of compounds of two different elements if belonging to the same group (for example, the group IV), for example SiGe.

Furthermore, although in the present description reference has been explicitly made only to a solar cell with variable band gap obtained by means of a non-uniform concentration profile of an element along the depth of at least one base of a junction of the cell, the concepts of the present invention may be also applied to the case where the emitter of at least one junction has an element of the compound that forms it with a concentration profile that is not uniform. In this case, the concentration of the element (for example, In) is made to vary along its depth (i.e., along the x direction of FIG. 1) from a first value C' in the lower portion of the emitter (for example, at the interface between the emitter and the possible underlying spacer layer) to a second value C''<C' in the upper portion of the emitter (for example at the interface between the emitter and the overlying window layer). With a concentration profile of this type, the valence band has portions with values of electronic energy higher than those of the valence band corresponding to the uniform concentration. The valence band exhibits higher electronic energy values in the deepest areas of the emitter, i.e., for low values of x, and lower values for higher values of x. Consequently, the band gap has a not uniform profile along x, with an initial value E' at the interface between the emitter and the spacer layer below and a final value E''>E' at the interface between the emitter and the window layer above. Preferably, the initial value E' of the band gap is set to be equal to or greater than the maximum value of the forbidden band in the base.

Similar considerations may apply in the case of mixed solutions with non-uniform concentration profiles both along the depth of the base, and along the depth of the emitter.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

The invention claimed is:

1. Monolithic photovoltaic cell comprising at least one junction, wherein each one of said at least one junction comprises a base formed by a doped semiconductor material of a first conductivity type and an emitter formed by a doped semiconductor material of a second conductivity type opposed to the first, said emitter being stacked on the base according to a first direction, the semiconductor material of the base and/or of the emitter of at least one of said at least one junction being a semiconductor material formed by a compound of at least one first element and a second element, wherein the band gap and the lattice constant of said semiconductor material of the base and/or of the emitter depend on the concentration of said first element in said compound with respect to said second element, characterized in that said concentration of the first element in said compound with respect to the second element is not uniform along said first direction, being equal to a first value at a lower portion of said base and/or emitter and being equal to a second value lower than the first value at an upper portion of said base and/or emitter, said upper portion being above said lower portion according to the first direction, and said semiconductor material of said base and/or emitter of the at least one of said at least one junction is formed by an Indium, Gallium and Arsenic compound, said first element being Indium and said second element being Gallium.

2. Photovoltaic cell according to claim 1, wherein said concentration corresponds to a non-increasing function along said first direction.

3. Photovoltaic cell according to claim 2, wherein said concentration corresponds to a decreasing function along said first direction.

4. Photovoltaic cell according to claim 1, further comprising a substrate formed by a further material having a first lattice constant, said at least one junction being stacked on said substrate according to the first direction, said concentration of the first element being such that the semiconductor material of said base and/or emitter of the at least one of said at least one junction has a second lattice constant different from the first lattice constant in a portion of said base and/or emitter having a thickness along the first direction lower than a critical thickness, said critical thickness being inversely proportional to the difference between the first and the second lattice constant.

5. Photovoltaic cell according to claim 1, wherein:
the at least one junction comprises a first junction, a second junction and a third junction, said second junction being stacked on the first junction according to the first direction and said third junction being stacked on the second junction according to the first direction, and
said at least one of said at least one junction is the second junction.

6. Photovoltaic cell according to claim 1, wherein:
said first concentration value is such that the Indium/Gallium ratio in the compound is equal to 3-10%, and
said second concentration value is such that the Indium/Gallium ratio in the compound is equal to 0-2%.

* * * * *